Oct. 21, 1952 L. STANTON 2,615,064

AMPLIFIER FOR STABILIZING SMALL UNIDIRECTIONAL SIGNALS

Filed Dec. 22, 1950 2 SHEETS—SHEET 1

INVENTOR.
LEONARD STANTON
BY Arthur H. Swanson
ATTORNEY.

Oct. 21, 1952 L. STANTON 2,615,064

AMPLIFIER FOR STABILIZING SMALL UNIDIRECTIONAL SIGNALS

Filed Dec. 22, 1950 2 SHEETS—SHEET 2

INVENTOR.
LEONARD STANTON
BY Arthur H. Swanson
ATTORNEY.

Patented Oct. 21, 1952 2,615,064

UNITED STATES PATENT OFFICE 2,615,064

AMPLIFIER FOR STABILIZING SMALL UNIDIRECTIONAL SIGNALS

Leonard Stanton, Philadelphia, Pa., assignor to Minneapolis-Honeywell Regulator Company, Minneapolis, Minn., a corporation of Delaware Application December 22, 1950, Serial No. 202,267

5 Claims. (Cl. 171—95)

The present invention relates generally to electronic apparatus of the type employed for the amplification of small unidirectional electrical signals. More specifically, the invention is concerned with improved electronic amplifying apparatus of the type wherein a small unidirectional input signal is converted into a corresponding alternating current signal which is amplified, rectified, and fed back to the input portion of the apparatus to provide stabilization of the amplified output signal.

A general object of the present invention is to provide an improved apparatus for effecting the amplification of a small unidirectional electrical signal in the manner described above, and for stabilizing the signal so amplified by feeding back at least a part thereof to the input portion of the apparatus.

A specific object of the invention is to provide an improved apparatus for amplifying and stabilizing a small unidirectional signal in the above manner wherein the filtering of the rectified signal does not cause the introduction of objectionable time lags and phase shifts into the amplifying and stabilizing procedure.

A still more specific object of the invention is to provide apparatus wherein the small unidirectional signal to be amplified is first converted into a corresponding alternating current signal, is next amplified in an alternating current amplifier, is then synchronously rectified, and is finally amplified and fed back at least in part to the input of the conversion portion of the apparatus.

The general form of apparatus, according to the present invention, comprises first and second electronic amplifiers each having an input circuit and an output circuit, a converter for impressing on the input circuit of the first amplifier an alternating current signal derived from a small unidirectional signal, a synchronous rectifier connected to the output circuit of the first amplifier for rectifying the amplified alternating current signal, a filter connecting the rectifier to the input circuit of the second amplifier, and a feedback connection between the output circuit of the second amplifier and the converter for opposing at least a portion of the signal amplified by the second amplifier to an input signal for deriving the first mentioned signal to be amplified.

In a preferred form of the apparatus of the invention, the synchronous rectifier comprises means for effectively short-circuiting at least a portion of the output circuit of the first amplifier in synchronism with the frequency of the alternating current signal and hence a synchronism with the operation of the converter. By achieving synchronized rectification in this manner, it is possible to employ therefor a switching mechanism which can be actuated by the converter.

Accordingly, an object of the present invention is to provide apparatus of the type specified generally above, wherein the rectification of the amplified alternating current signal is effected, before final amplification, by synchronously short-circuiting at least a part of the output circuit of the first section of the amplifier.

Another object of the invention is to provide apparatus of the general form specified above which is provided with extremely simple means for preventing instability of the apparatus due to sudden transient or rapidly repeated changes of substantial magnitude in the voltage of the source of electrical power employed to energize the apparatus.

As will become apparent, the invention is well adapted for use in deriving a direct current voltage of constant magnitude from a commercial source of voltage which fluctuates in more or less erratic and unpredictable manner. The constant voltage thus derived may be used for various purposes such, for example, as energizing a measuring bridge circuit of the type commonly employed in self-balancing potentiometers. The invention is also adapted for use in measuring systems of the known type wherein a minute unidirectional voltage is converted into an alternating current signal which is then subjected to alternating current amplification, and which is thereafter rectified and measured by a millivoltmeter or other available direct current measuring instrument.

In such measuring systems, it has been previously proposed to feed back a portion of the rectified output signal to the amplifier input circuit to oppose therein the unidirectional signal to be measured, and thereby to obtain improved operational stability. However, provisions heretofore proposed for the purpose have been open to the objection that they require the use of a relatively large filter at the output of the measuring system, since the output voltage of such a system is relatively large. The use of a large capacity output filter is undesirable because it introduces an objectional lag between the time at which a change in the amplifier output signal occurs and the time at which that change is reflected in the signal feed back to the input circuit from the filter.

In the preferred form of the present invention, this difficulty is avoided in a simple and effective manner by combining with the previously mentioned synchronous rectifier a filter comprising only a resistance and a condenser. Because of its location before the final portion of the amplifier, the filter is effective substantially to eliminate all significant alternating current ripple from the signal applied to the input circuit of the second or final amplifier section. The rectified signal applied to the input circuit of the second amplifier is small in comparison with the output signal of the second amplifier, and the filter employed may be of such relatively small capacity that its operation will not create objectionable phase shifts and time lags.

The same need for avoiding the relatively large time lags and phase shifts which are the inherent results of the action of a large filter exists in the production of a constant unidirectional voltage for energizing bridge circuits and analagous purposes as exists in measuring systems of the above mentioned type, and accordingly the present invention represents improvements in constant voltage-producing apparatus as well as in minute-voltage measuring apparatus.

The various features of novelty which characterize my invention are pointed out with particularity in the claims annexed to and forming a part of this specification. For a better understanding of the invention, however, its advantages, and specific objects attained with its use, reference should be had to the accompanying drawings and descriptive matter in which I have illustrated and described preferred embodiments of the invention.

Figure 1:
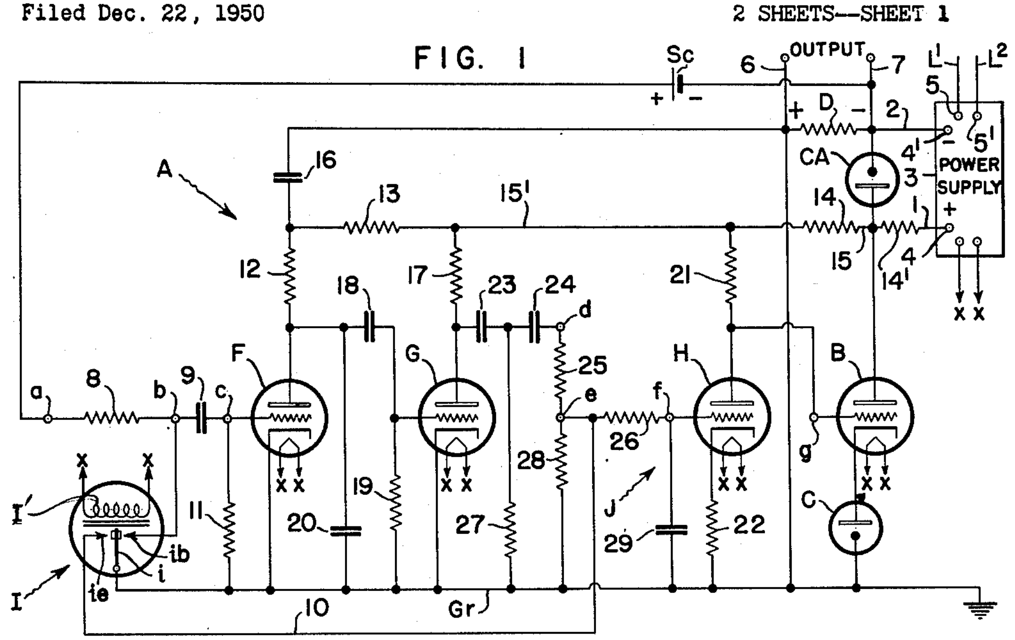
Fig. 1 is a circuit diagram illustrating a form of the invention adapted for use in deriving a constant voltage.

The apparatus shown by way of example in Fig. 1 comprises a circuit network having conductors 1 and 2 connected to a suitable source of unidirectional energizing current 3. As diagrammatically shown, the source 3 may well be a conventional rectifier-type power supply having respective positive and negative D. C. output terminals 4 and 4' to which the conductors 1 and 2 are respectively connected. The input terminals 5 and 5' of the power supply 3 are respectively connected to alternating current supply conductors L' and $L^2$. The latter supply alternating current to the power supply 3 at conventional voltage and frequency, such as 115 volts and 60 cycles per second.

The anode and cathode of a triode valve B, the anode and cathode of a voltage regulating glow-discharge tube C, and a load resistor D are connected in series in the order stated in the portion of the output circuit of the amplifier between the energizing terminals 1 and 2. The cathode of the glow-discharge tube C and one end of the load resistor D are connected to a grounding conductor G*r*. The glow-discharge tube C may well be of the commercially available VR–75 type, operating to maintain the potential of its anode 75 volts positive relative to the potential of its grounded cathode. Conductors 6 and 7 connected to the positive and negative ends of the resistor D constitute the constant voltage output terminals of the network. Means including a standard cell Sc, tend to maintain the voltage drop in the resistor D at a desired constant value.

Figure 2:
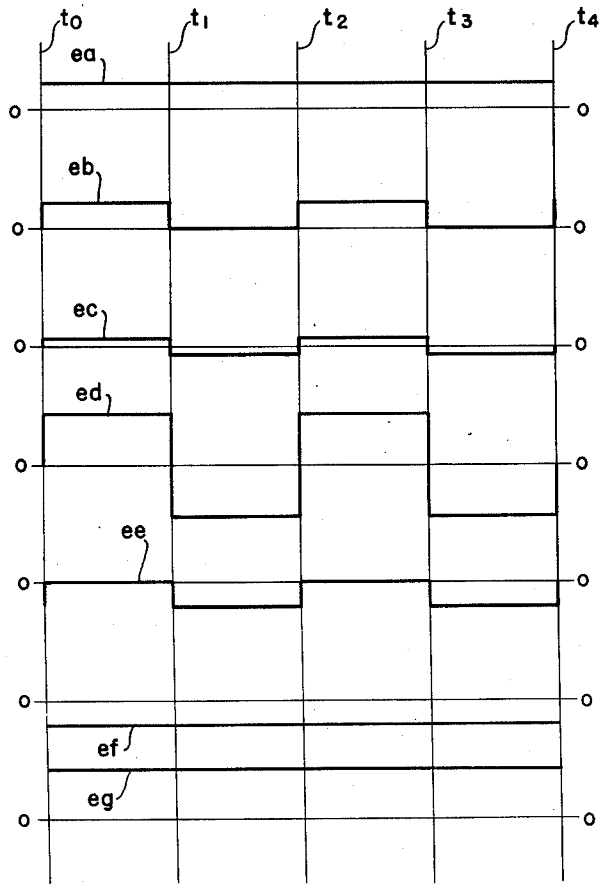
Fig. 2 is a chart including voltage curves illustrating the operation of the apparatus shown in Fig. 1.

The cell Sc has its negative terminal connected to the negative terminal of the resistor D and has its positive terminal connected at the point *a* to a resistor 8 and is connected through the resistor 8 and a condenser 9 in series therewith to the control grid of an amplifier valve F. The valve F is the initial or input stage valve of a multistage amplifier which, as shown, comprises second and third stage valves G and H. The previously mentioned valve B forms the fourth or output stage valve of the amplifier. Voltage curves *ea*, *eb*, *ec*, *ed*, *ee*, *ef*, and *eg*, included in Fig. 2 show voltages respectively existing under conditions hereinafter described, at points *a*, *b*, *c*, *d*, *e*, *f*, and *g* in the circuit network shown in Fig. 1.

At this point, it is noted that the adjacent terminals of the resistor 8 and condenser 9 are connected at the point *b* which is alternately connected to and disconnected from ground by a switch mechanism or vibrator unit I. The vibrator unit I comprises a vibrating reed or contact *i* which is connected to ground, and is vibrated back and forth between, and alternately engages, contacts *ib* and *ie*. The contact *ib* is connected to the network point *b*, and the contact *ie* is connected through a conductor 10 to an intermediate amplifier point *e*. The contact *i* may be polarized and is vibrated at a predetermined frequency, which may well be 60 cycles per second, by means of coil I', energized by alternating current of said frequency.

The amplifier valves F and G may be of the commercially available 7F7 type, and each of the valves H and B may be one of the two triode valves in a twin tube of the commercially available 7N7 type. The valve F has its control grid connected to ground through a grid resistor 11, and has its cathode connected to ground and has its anode connected through resistors 12, 13, 14 and 14' to the network terminal 1. A voltage regulating glow-discharge tube CA has its anode connected to a circuit point 15 which connects the resistors 14 and 14', and has its cathode connected to the terminal 2. The glow-discharge tube CA may well be of the commercially available VR–150 type, adapted to maintain the voltage of the point 15 at an approximately constant positive potential of 150 volts relative to the potential of the terminal 2.

The connected ends of the resistors 12 and 13 are connected to ground by a condenser 16. The valve G has its anode connected to a conductor 15' through an anode resistor 17, and has its cathode connected to ground. The control grid of the valve G is connected to the anode of the valve F by a coupling condenser 18, and is connected to ground by a grid resistor 19. The anode of the valve F is also connected directly to ground by a condenser 20. The valve H has its anode connected to the conductor 15' through an anode resistor 21 and directly connected to the control grid of the valve B, and has its cathode connected to ground through a cathode resistor 22.

The anode of the valve G is connected to the control grid of the valve H through a condenser 23, a condenser 24, a resistor 25, and a resistor 26 connected in series in the order stated. The connected terminals of the condensers 23 and 24 are connected to ground by a resistor 27. The previously mentioned point *e* is the junction point of the resistors 25 and 26, and is permanently connected to ground by a resistor 28, and is connected through the previously mentioned conductor 10 to the stationary contact *ie* of the vibrator I. The operation of the vibrator I thus intermittently connects the point *e* to ground with the frequency of vibration of contact *i*.

The point *e* may be regarded as the input point, and the point *f* at which the connected terminals of the resistor 28 and a condenser 29 are connected to the control grid of the valve H, may be regarded as the output point of a filter J. The latter is provided to eliminate substantially all alternating current components from the signal passing to the control grid of the valve H. The filter J comprises the resistor 26 which may have a resistance of ten megohms and the condenser 29 which connects point *f* to ground and may have a capacitance of one mf. The resistors 25 and 28 may each have a resistance of one megohm.

The apparatus shown in Fig. 1 is so designed and proportioned that under ideal conditions, the voltage drop in the load resistor D will be equal to the voltage of the standard cell Sc. The resistance of the resistor 8 may well be fifty thousand ohms, the resistance of the grid resistor 11 may well be one megohm, and the capacity of the condenser 9 may well be 0.1 mf. Under ideal conditions, no current will be transmitted through the standard cell, and the potential of the point *a* in the conductor connecting the standard cell and resistor 8, will be at the ground potential. Under such operating conditions, the potential of the point *b* between the resistor 8 and condenser 9 will be equal to the potential of the point *a*, since the contact *i* periodically connected to the point *b* through the contact *ib* is grounded. When the potential drop through the load resistor D is less or greater than the standard cell voltage, the potential of the point *a* will become respectively positive or negative relative to the ground potential, and the potential at the network point *b* will then fluctuate between the ground potential attained during the periods in which the contacts *i* and *ib* are in engagement, and a potential approximately equal to the potential of the point *a*, attained when the contacts *i* and *ib* are out of engagement.

The variations in the potential at the point *b* produced by the engagement and separation of the contacts *i* and *ib*, result in the transmission of an alternating current signal through the condenser 9 to the control grid of the valve F. The frequency of that signal depends on the oscillation frequency of the contact *i*, and hence on the frequency of the alternating current supplied to the energizing coil I′ of the vibrator I. Said signal will be phase with, or 180° out of phase with the energizing current supplied to the coil I′ accordingly as the potential at the point *a* is positive or negative relative to the ground potential.

The voltage curves included in Fig. 2, illustrate voltages existing at particular points in the circuit network under the operating condition in which the current flow through the load resistor D is below normal, so that the potential drop in the load resistor is less than the voltage of the standard cell Sc. Associated with each of the Fig. 2 voltage curves is a line 0—0 which represents ground or zero potential, and a curve point above or below the associated line 0—0 represents a positive or negative potential, respectively. In Fig. 2 the vertical lines *t0*, *t1*, *t2*, *t3*, and *t4* are time lines. The line *t0* is assumed to represent the beginning of the observation period in which the voltage shown by the different voltage curves of Fig. 2 were developed, and that period is assumed to start at the beginning of a half cycle of the vibratory movement of the vibrator contact *i* in which the latter is out of engagement with the stationary contact *ib*. The time line *t1* marks the instant at which the half cycle beginning at *t0* is terminated. Similarly the time intervals *t1*—*t2*, *t2*—*t3*, and *t3*—*t4* represent time periods corresponding to the second, third and fourth half cycles of the vibratory movement of the contact *i* during the contact period. The contacts *i* and *ib* are in engagement only during the half cycles *t1*—*t2* and *t3*—*t4*. Only during such an engagement can the standard cell be subjected to a voltage drain, and that drain, when it exists, is relatively minute because of the substantial resistance of the drain circuit which includes the resistor 8.

During the observation period shown in Fig. 2, the potential of the point *a* is assumed to be positive relative to ground and is represented in Fig. 2 by the curve *ea*. The fluctuating voltage at the point *b* when the potential at the point *a* is positive relative to ground, is represented by the curve *eb* of Fig. 2. That curve comprises square wave portions above, and square wave portions at the zero or ground potential level. While in each of the Fig. 2 curves, the displacement of a curve point up or down from the zero line 0—0, indicates that the potential of said point is positive or negative relative to ground, the magnitude of the vertical displacement of a curve point from the line 0—0 is not intended to, and does not indicate the precise magnitude of the potential difference between the curve point and ground.

The curve *ec* of Fig. 2 represents the voltage at the point *c* in the connection between the control grid of the valve F and condenser 9. The curve *ec* is generally similar in shape to the curve *eb*, but the lower horizontal portions of the curve *ec* corresponding to the time intervals in which the vibrating contact *i* is in engagement with the contact *ib*, are somewhat below the corresponding zero potential line 0—0. The difference in the shapes of the curves *eb* and *ec* just mentioned, is directly due to the action of the condenser 9, which passes only the alternating component of the voltage at the point *b*, so that an alternating current signal is impressed on the input circuit of the valve F, when the potential at the point *b* differs from the ground potential.

The curve *ed* of Fig. 2 represents the potential, during the observation period, of the point *d* in the connection between the condenser 24 and resistor 25. The shape of the curve *ed* is generally similar in character to the shape of the curve *ec*, but to indicate the amplification effected by the amplifier valves F and G, the horizontal portions of the curve *ed* are shown farther away from the corresponding zero potential line 0—0, than are the horizontal portions of the curve *ec*.

The curve *ee* of Fig. 2 represents the voltage at the point *e* when the potential at the point *a* is positive relative to ground. That curve *ee* includes portions at the ground potential, and other portions at a potential lower than the ground potential. The voltage represented by the curve *ee* is thus essentially a pulsating negative voltage. The portions of the curve *ee* coincident with the zero line 0—0, represent the voltage at the point *e* when the contacts *i* and *ie* engage, and in connection with the conductors 10 and *Gr*, short circuit the resistor 28 and effectively ground the point *e*. The negative voltage portions of the curve *ee* represent the voltage condition at the point *e* when the potential at the point *b* is reduced to equality with the ground potential by the engagement of the contacts *i* and *ib*.

The voltage curve *ef* of Fig. 2 represents the output voltage of the filter J including the resistor 26 and condenser 29. The voltage shown by the curve *ef* is a continuous or constant negative voltage. That voltage, when impressed on the control grid of the valve H, causes the latter to operate as a direct current amplifier, and with the anode of the valve H directly connected to the control grid of the valve B, the latter also acts as a direct current amplifier.

The resistance of the cathode resistor 22 of the valve H may well be a thousand ohms. In consequence, the potential at the point *g* which is between and directly connected to the anode of the valve H and the control grid of the valve B, is definitely positive and is shown by the Fig. 2 curve *eg*. However, the potential of the control grid of the valve B may be suitably negative relative to the cathode of the valve B to control the current flow through the valve B, since the cathode potential of the valve B is maintained 75 volts positive, relative to ground, by the glow-discharge tube C through which said cathode is connected to the grounding conductor *Gr*.

As will be apparent, on an operating condition change resulting in a voltage drop in the load resistor D which exceeds the voltage of the standard cell, the potential of the point *a* becomes negative relative to the ground potential and negative relative to the average potential of the point *b*. When this occurs, an alternating current signal will be transmitted through the point *c* to the control grid of the valve F. A curve illustrating the voltage then existing at the point *c* will obviously differ 180° in phase from the curve *ec* shown in Fig. 2. The reason for this phase difference becomes plainly apparent when account is taken of the fact that when the contact *i* moves out of engagement with the contact *ib*, the potential at the point *b* must diminish when the potential at the point *a* is negative relative to ground, whereas, when the potential at the point *a* is positive relative to ground, the separation of the contacts *i* and *ib* results in an increase in the potential of the point *b* relative to ground. With the potential at the point *a* negative relative to ground, the voltages at the points *d* and *e* are also 180° out of phase with the voltages at the points represented by the curves *ed* and *ee* of Fig. 2. When the potential at the point *a* is negative relative to ground, the unidirectional voltage at the point *f* will be less negative than the voltage represented by the curve *ef*, and the unidirectional voltage at the point *g* will be less positive than the voltage represented by the Fig. 2 curve *eg*. Thus, when the potential drop in the load resistor D is greater than it should be, and the potential of the point *a* is negative relative to ground, the signal voltages at the points *f* and *g* have the values needed to reduce the current flow through the load resistor D and thus restore equality in magnitude of the voltage drop in the resistor D and the standard cell voltage.

The change from the condition in which the voltage drop through the resistor D is less than the voltage of the standard cell Sc, to the condition in which said voltage drop is greater than the standard cell voltage, effects one or more polarity changes in each of the Fig. 2 voltage curves *ea*, *eb*, *ec*, *ed*, *ee*, and *ef*. Thus, after such a voltage change, the voltage represented in Fig. 2 by the curve *ea* would be represented by a straight line parallel to and below the corresponding zero voltage or ground potential 0—0, and the voltage represented in Fig. 2 by the curve *ef* would then be represented by a line above and parallel to the corresponding zero voltage line 0—0. The effect of such a condition change on the alternating current voltages at each of the points *b*, *c*, *d*, and *e*, is a 180° shift in phase. In consequence, the voltage at each of the points *b*, *c*, *d*, and *e*, which in Fig. 2 is represented by a horizontal line portion above or below the corresponding zero voltage line 0—0, would be represented, after the condition change, by a horizontal line portion respectively below or above the corresponding voltage line 0—0.

The change in the polarity of the point *a* from a positive value to a negative value has the effect of reducing the voltage of the point *g*, but would not change the polarity of the point *g* since the potential drop in the cathode resistor 22 of the valve H causes the potential of the anode of the valve H to be positive relative to ground under all operating conditions. The maintenance of the potential of the point *g* positive relative to ground is practically necessary to maintain the operativeness of the valve B if the latter is of any practically available type, in consequence of the fact that the valve C maintains the cathode of the valve B 75 volts positive relative to ground.

In practice, the valves B and H must each be conductive at all times. Each of those valves may be one of the twin valves of a tube of the commercially available 7N7 type. To maintain a voltage drop in the resistor D equal to the voltage of the standard cell, requires a plate current flow through the valve B of 10.185 milliamperes, on the assumption that the resistance of the resistor D is 100 ohms, as it may well be, and that the standard cell has the customary standard cell voltage of 1.0185 volts. The normal plate supply voltage for the 7N7 valve B may be assumed to be 250 volts. With that plate voltage, a net grid-cathode voltage of approximately —4 volts will cause the valve B to pass a plate current of 10.185 ma. Since the cathode of the valve B is 75 volts positive relative to ground, an effective net grid-cathode voltage of —4 volts means that the voltage at the point *g* is 71 volts positive relative to ground. On a change in the plate voltage of the valve B from the assumed normal 250 volts to 225 volts, the net grid-cathode voltage will have to increase from —4 volts to —3 volts to maintain the 10.185 ma. current flow through the load resistor D. Thus on such a change in plate voltage, the conductivity of the tube H must decrease sufficiently to make the point *g* 72 volts positive relative to ground. On an increase in the plate supply voltage for the valve B from 250 volts to 275 volts, the negative grid-cathode voltage must increase to —5 volts, and the voltage of the point *g* must be 70 volts positive relative to ground to permit the maintenance of the desired constant current flow of 10.185 ma. through the resistor D.

Under the ideal operating condition desired in which the voltage drop in the load resistor D is exactly equal to the magnitude of the opposing voltage of the standard cell, the point *a* will be at the ground potential. With the point *a* at ground potential, the point *b* will also be at ground potential and no alternating signal will be impressed on the control grid of the valve F. Theoretically, the potential of the point *c* will then be continuously negative as a result of grid current flow in the valve F, but the difference between the steady negative potential of the point *c*, and the ground potential will be so small as to be practically negligible. When no alternating current signal is impressed on the grid of the valve F, no alternating current signal will be impressed on the control grid of the valve G, and the latter will impress no alternating current potential on the point *d*. When the potential of the point *b* is equal to the ground potential, there will be a continuous unidirectional plate current flow through each of the valves F and G of a magnitude determined by the self-produced grid-cathode bias of the valve, but such currents then flowing through said valves will have no effect on the potential of the point *d*.

As previously stated, the valve H is conductive at all times, and must be to maintain the necessary plate current flow through the valve B. When an alternating signal is impressed on the point *d*, the conductivity of the valve H must be substantially due to the self-bias voltage between the grid and the cathode of the valve H produced by the cathode resistor 22 which may well have a resistance of a thousand ohms. While the grid current flow through the resistors 26 and 28 theoretically contributes some negative voltage to the overall bias effect on the tube H, the contribution is too small to be of practical significance. The small grid current flow through the resistors 28 and 26 and the intermittent short circuiting action of the circuit including the contacts *i* and *ie* and conductor 10, cooperate to produce voltage fluctuations at the points *d*, *e*, and *f* when no alternating signal is being impressed on the point *d*. Those fluctuations are insignificantly small, however, and may be disregarded from the practical standpoint.

The general operation of apparatus shown in Fig. 1 will be readily apparent, it is believed, from the foregoing description. The load resistor D is included in series with the terminals 1 and 2 of the D. C. voltage source 3, the anode and cathode of the amplifier valve B and the glow-discharge tube C. In consequence, the current flow through, and voltage drop in, the load resistor D will remain constant, will increase, or will decrease, accordingly as the plate current of the valve B respectively remains constant, is increased or is decreased. Any departure in the magnitude of the voltage drop in the resistor D from equality with the magnitude of the voltage of the standard cell Sc, creates a difference between the potential at the point *a* and the ground potential. When the voltage drop in the resistor D becomes greater than the voltage of the standard cell Sc, the point *a* potential becomes negative relative to the ground potential, and, as has been explained, results in a corrective reduction in the magnitude of the plate current through the valve B and through the load resistor D. Conversely, when the magnitude of the voltage drop in the resistor D becomes less than the voltage of the standard cell, the potential of the point *a* becomes positive relative to the ground potential and produces a corrective increase in the current flow through the valve B and through the resistor D to restore equality between the voltage drop in the resistor D and the voltage of the standard cell Sc.

As has been explained, the amplifier valve F receives an alternating current signal when the potential of the point *a* differs from the ground potential as a result of the operation of the vibrator switch mechanism I. The resultant pulsating space current flow through the valve F causes an alternating current signal to be applied to the control grid of the valve G. The filter J operates to cause the signal impressed on the control grid of the valve H to be a substantially non-pulsating unidirectional signal. The valve H thus operates as a direct current amplifier and causes the valve B to operate in the same manner. Therefore, the filter J operatively divides the amplifier into an alternating current amplifier section including the valves F and G, and a direct current section comprising the valves H and B.

Under the operating conditions in which an alternating current signal is impressed on the input circuit of the valve F, the amplification effected by the alternating current amplifier valves F and G, causes the minimum value of the direct current signal transmitted from the output point *f* of the filter J to the control grid of the valve H to be large enough for effective amplification in a direct current amplifier, without objectionable effects experienced in high amplification of minute unidirectional voltages. Those effects are due to tube noises, filament voltage changes, and other causes introducing amplifier "drifts" of the same order of magnitude as the changes in the minute unidirectional voltage measurements which it is desired to detect, and which make direct current amplifiers highly unstable when used to amplify minute direct current voltage.

By dividing the amplifier into separate alternating current and direct current amplifier sections, with a filter between the two sections, the filter action required for the conversion of the alternating current output of the alternating current amplifier section into direct current, may be effected by a filter small enough to avoid the undesirably high time lags inevitable in the use of a filter at the output end of the amplifier and large enough to substantially eliminate alternating currents from the fully amplified output.

Figure 3:
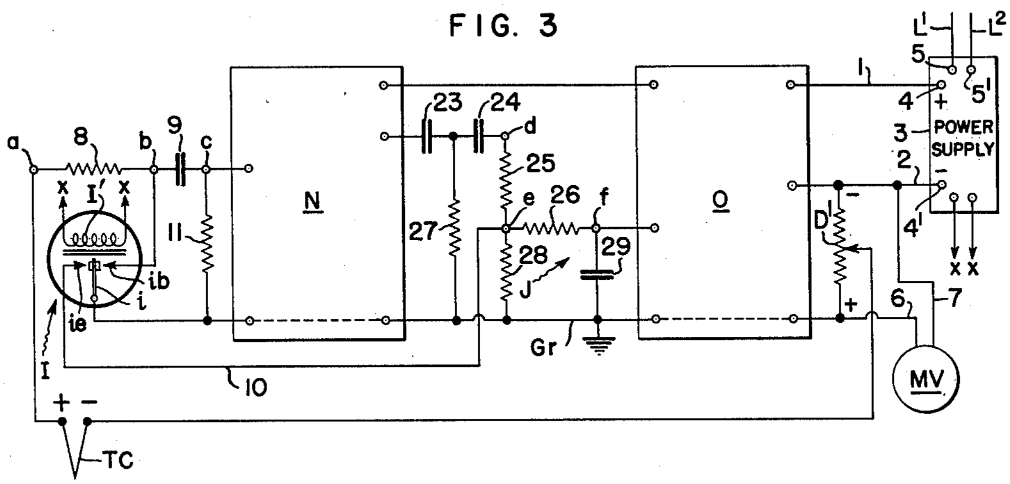
Fig. 3 is a circuit diagram illustrating a form of the invention adapted for use in amplifying a minute unidirectional current to permit it to be measured by a device of otherwise insufficient sensitivity.

In Fig. 3, I have illustrated the use of amplifying apparatus like that shown in Fig. 1, in directly measuring the voltage of a thermocouple TC connected in series with the load resistor D' and in effect replacing the standard cell Sc of Fig. 1. In Fig. 3, a millivoltmeter or other direct current meter MV is connected across the load resistor D' and directly measures the voltage drop across the latter. Except for the substitution of the thermocouple TC for the standard cell Sc, and for possible small changes in impedance values which may be found desirable, the apparatus illustrated in Fig. 3 may be identical with that illustrated in Fig. 1. For drawing simplification purposes, the alternating and direct current sections of the amplifier are not shown in detail in Fig. 3, but are included in the diagram blocks N and O, respectively.

The Fig. 3 apparatus may well be so calibrated and arranged that for some particular thermocouple voltage, which may be the assumed normal or average voltage, the thermocouple voltage will be balanced by the voltage drop in the resistor D′ when the potential at the point *a* is zero relative to ground. In such case, the calibration and arrangement of the apparatus should be such that when the thermocouple voltage increases or decreases and thereby makes the potential of the circuit network point *a* respectively positive or negative, the resultant change in the control signal transmitted through the point *c* to the input of the amplifier section N will respectively increase or decrease the amplifier output current to respectively increase or decrease the potential drop in the resistor D′ nearly enough to balance the increased or decreased thermocouple voltage. With the simple control arrangement described, the regulation of the current flowing through the resistor D′ must be regulation with a "drooping characteristic" to insure regulation stability. Such regulation requires that when the thermocouple voltage changes and attains a new value, the corrective change in potential drop in the resistor D′ should be less than that required to wholly eliminate the existing unbalance, and should be large enough to prevent a further unbalancing change in the same direction, so long as said new voltage value is maintained.

While the amplifier system shown in Fig. 1 is of a form well adapted for use in the practice of the present invention, other amplifier arrangements may be employed in lieu thereof. Thus in Fig. 4, I have illustrated the use of the invention in producing a substantially constant output current in the same general manner in which it is produced in Fig. 1, by the use of apparatus including two pentode valves F′ and G′ in lieu of the two triode valves F and G of Fig. 1. The valves F′ and G′ may well be of the commercially available 6SJ7 type. As shown, the circuit connections to the valves F′ and G′ differ from the connections of the valves F and G, essentially only by the inclusion of suitable screen grid connections to the valves F′ and G′, and the provision of a cathode resistor for each of the valves F′ and G′, with a condenser in parallel with each resistor.

Figure 4:
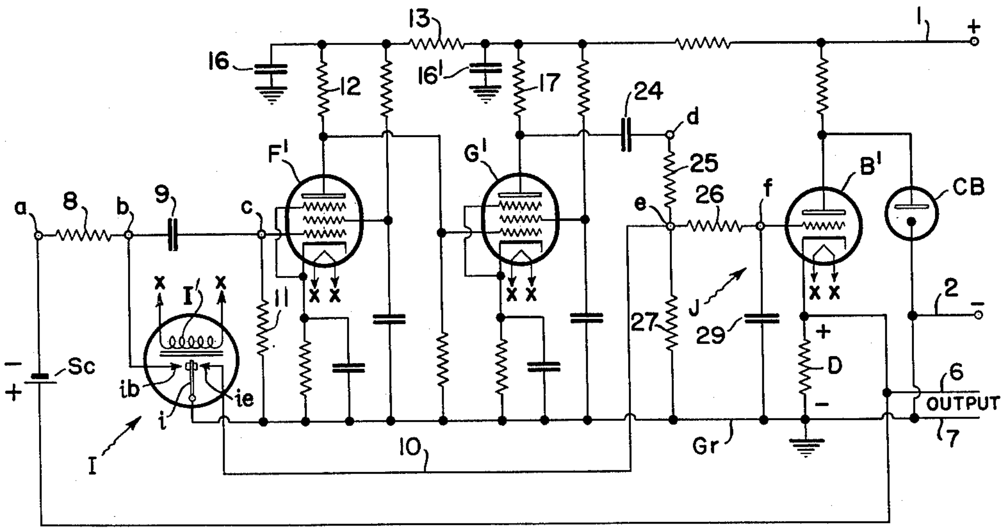
Fig. 4 is a circuit diagram illustrating a modified and preferred form of the apparatus shown in Fig. 1.

The arrangement shown in Fig. 4 also differs from that shown in Fig. 1, by the use in the direct current amplifier section of a single valve B′ in lieu of the two valves H and B of Fig. 1. The valve B′ may advantageously be of the commercially available 12AU7 type. In Fig. 4, the glow-discharge tube C is omitted, and the anode voltage of the valve B′ is fixed by connecting a glow-discharge tube CB between the anode of the valve and ground. The glow-discharge tube CB may well be of the commercially available VR105 type, operating to maintain the potential of the anode of the tube 105 volts positive relative to ground. In Fig. 4, the portion of the circuit network connecting the anode of the valve G′ to the network point *d*, omits the condenser 23 and resistor 27 of Fig. 1.

Notwithstanding its inclusion of three valves instead of four, and the other differences between the Fig. 4 arrangement and the arrangement shown in Fig. 1, the overall operation of the arrangement shown in Fig. 4 is essentially the same as the overall operation of the arrangement shown in Fig. 1.

While, in accordance with the provisions of the statutes, I have illustrated and described the best form of embodiment of my invention now known to me, it will be apparent to those skilled in the art that changes may be made in the form of the apparatus disclosed without departing from the spirit of my invention as set forth in the appended claims, and that in some cases certain features of my invention may be used to advantage without a corresponding use of other features.

Having now described my invention, what I claim as new and desire to secure by Letters Patent, is:

1. In regulating apparatus comprising a circuit network including first and second electronic amplifiers each having at least one electronic valve including anode, cathode, and control grid elements, having an input circuit including the control grid and cathode of a valve included in that amplifier, and having an output circuit including the anode and cathode of a valve included in that amplifier, said network also including terminals adapted to be connected to a source of energizing voltage, connections between said terminals and said valves operative to supply anode current to the latter, a first resistor connected in the output circuit of said second amplifier and across which said apparatus is operative to maintain a substantially constant voltage drop, a second resistor, a source of standard voltage, conductors connecting said first and second resistors and said standard voltage source in series in the input circuit of said first amplifier with the standard voltage of said standard voltage source in bucking relation to the said voltage drop across said first resistor, and a D. C. to A. C. converter connected in the last mentioned input circuit and operative to impress thereon for amplification by said first amplifier an alternating current signal of a magnitude which is dependent upon the difference between the magnitudes of said standard voltage and said voltage drop and of a phase which is dependent upon which of said magnitudes is the greater, the improvement comprising switching means connected across at least a portion of the output circuit of said first amplifier and operative to short-circuit effectively said output circuit portion during periods coinciding with alternate half cycles of said alternating current signals to derive a pulsating direct current signal of a magnitude and polarity respectively dependent upon the magnitude and phase of the first mentioned alternating current signal, a filter circuit having an input portion connected to said output circuit portion and operative to derive from said pulsating signal a substantially ripple-free direct current signal, said filter circuit having an output portion in which the last mentioned signal appears, and conductor means connected between the output portion of said filter circuit and the input circuit of said second amplifier and operative to apply said last mentioned signal to said second amplifier for amplification therein.

2. An improvement as specified in claim 1, in which said switching means is connected to and actuated by said converter.

3. In regulating apparatus comprising a circuit network including first and second electronic amplifiers each having at least one electronic valve including anode, cathode, and control grid elements, having an input circuit including the control grid and cathode if a valve included in that amplifier, and having an output circuit including the anode and cathode of a valve included in that amplifier, said network also including terminals adapted to be connected to a source of energizing voltage, connections between said terminals and said valves operative to supply anode current to the latter, a first resistor connected in the output circuit of said second amplifier and across which said apparatus is operative to maintain a regulated voltage drop, a second resistor, a source of unidirectional voltage, conductors connecting said first and second resistors and said unidirectional voltage source in series in the input circuit of said first amplifier with the voltage of said unidirectional voltage source in bucking relation to the said voltage drop across said first resistor, and a D. C. to A. C. converter connected in the last mentioned input circuit and operative to impress thereon for amplification by said first amplifier an alternating current signal of a magnitude which is dependent upon the difference between the magnitudes of said unidirectional voltage and said voltage drop and of a phase which is dependent upon which of said magnitudes is the greater, the improvement comprising switching means connected across at least a portion of the output circuit of said first amplifier and operative to short-circuit effectively said output circuit portion during periods coinciding with alternate half cycles of said alternating current signals to derive a pulsating direct current signal of a magnitude and polarity respectively dependent upon the magnitude and phase of the first mentioned alternating current signal, a filter circuit having an input portion connected to said output circuit portion and operative to derive from said pulsating signal a substantially ripple-free direct current signal, said filter circuit having an output portion in which the last mentioned signal appears, and conductor means connected between the output portion of said filter circuit and the input circuit of said second amplifier and operative to apply said last mentioned signal to said second amplifier for amplification therein.

4. In regulating apparatus comprising a circuit network including first and second electronic amplifiers each having at least one electronic valve including anode, cathode, and control grid elements, having an input circuit including the control grid and cathode of a valve included in that amplifier, and having an output circuit including the anode and cathode of a valve included in that amplifier, said network also including terminals adapted to be connected to a source of energizing voltage, connections between said terminals and said valves operative to supply anode current to the latter, a first resistor connected in the output circuit of said second amplifier and across which said apparatus is operative to maintain a regulated voltage drop, a second resistor, a source of unidirectional voltage, conductors connecting said first and second resistors and said unidirectional voltage source in series in the input circuit of said first amplifier with the voltage of said unidirectional voltage source in bucking relation to the said voltage drop across said first resistor, and a D. C. to A. C. converter connected in the last mentioned input circuit and operative to impress thereon for amplification by said first amplifier an alternating current signal of a magnitude which is dependent upon the difference between the magnitudes of said unidirectional voltage and said voltage drop and of a phase which is dependent upon which of said magnitudes is the greater, the improvement comprising switching means connected across at least a portion of the output circuit of said first amplifier and operative to short-circuit effectively said output circuit portion during periods coinciding with alternate half cycles of said alternating current signals to derive a pulsating direct current signal of a magnitude and polarity respectively dependent upon the magnitude and phase of the first mentioned alternating current signal, a filter circuit having an input portion connected to said output circuit portion and operative to derive from said pulsating signal a substantially ripple-free direct current signal, said filter circuit having an output portion in which the last mentioned signal appears, conductor means connected between the output portion of said filter circuit and the input circuit of said second amplifier and operative to apply said last mentioned signal to said second amplifier for amplification therein, and a meter connected across said first resistor to measure the voltage drop therein, and thereby provide a measure of said unidirectional voltage.

5. Apparatus for producing a direct current of a substantially constant predetermined magnitude, comprising a circuit network including a first amplifier operative as an alternating current amplifier, a second amplifier operative as a direct current amplifier, each of said amplifiers having an input circuit and an output circuit, a filter connected between the output circuit of said first amplifier and the input circuit of said second amplifier and comprising a resistor and a condenser connecting one terminal of said resistor to ground, the output circuit of said second amplifier including a valve having an anode, a cathode, and a control grid, means including energizing terminals for connecting said network to a source of energizing voltage, a load resistor, conductors connecting said anode, said cathode, said load resistor, and said terminals in series in the output circuit of said second amplifier, whereby a current is caused to flow through said load resistor which produces a potential drop thereacross, a source of unidirectional voltage connected in series with said load resistor and in bucking relation to said potential drop, and means for impressing an alternating current control signal on the input circuit of said first amplifier selectively dependent on the magnitude and polarity of the difference between said potential drop across said load resistor and the unidirectional voltage of said source, said means comprising a resistor and a condenser connected in series in the order stated between the second terminal of said voltage source and the input circuit of the first amplifier, and mechanism for intermittently connecting the connected terminals of the last mentioned resistor and condenser to ground and thereby impressing an A. C. signal on the input circuit of the first amplifier.

LEONARD STANTON.

REFERENCES CITED

The following references are of record in the file of this patent:

UNITED STATES PATENTS

| Number | Name | Date |
|---|---|---|
| 2,150,006 | Parker | Mar. 7, 1939 |
| 2,456,420 | Jackson | Dec. 14, 1948 |
| 2,459,730 | Williams, Jr. | Jan. 18, 1949 |
| 2,497,129 | Liston | Feb. 14, 1950 |
| 2,508,082 | Wald | May 16, 1950 |